DIRECT-COUPLED WIDE-BAND AMPLIFIER INCLUDING VACUUM TUBES AND TRANSISTORS

Filed May 5, 1958

NORMAN B. SCHROCK
INVENTOR

BY [signature]
ATTORNEYS

United States Patent Office 2,963,655

Patented Dec. 6, 1960

2,963,655

DIRECT-COUPLED WIDE-BAND AMPLIFIER INCLUDING VACUUM TUBES AND TRANSISTORS

Norman B. Schrock, Los Altos, Calif., assignor to Hewlett-Packard Company, Palo Alto, Calif., a corporation of California Filed May 5, 1958, Ser. No. 732,906

3 Claims. (Cl. 330—3)

This invention relates generally to a wide band amplifier and more particularly to wide band amplifiers suitable for use in the deflection circuits of oscilloscopes and the like.

In many applications, for example, in the vertical deflection circuits of oscilloscopes, it is desirable to have direct coupled amplifiers which respond to a wide range of frequencies, for example from D.-C. to video. With amplifiers of this type, a broad range of frequencies or a complex wave, for example, squarewaves, may be amplified. It is desirable in many applications to be able to amplify D.C. and slow varying voltages.

Prior art amplifiers of the above character are sensitive to changes in tube parameters and applied voltages. In general, the input and output voltages appear at very different D.-C. voltage levels. The input circuits may have one side grounded but the output circuit will be at a relatively high D.-C. voltage difference, or vice versa. When several stages are employed in cascade, the required power supplies become relatively complex.

It is a general object of the present invention to provide an improved direct coupled wide band amplifier.

It is another object of the present invention to provide a direct coupled wide band amplifier in which the input and output circuits operate at nearly the same D.-C. voltage levels.

It is another object of the present invention to provide a wide band amplifier which is relatively insensitive to changes in characteristics of the amplifying devices employed and applied voltages.

It is another object of the present invention to provide a direct coupled wide band amplifier including vacuum tubes and transistors having an improved bandwidth in comparison to circuits employing either alone.

It is another object of the present invention to provide a direct coupled wide band amplifier including vacuum tubes and transistors with the tubes and transistors being operated in their most favorable regions.

It is another object of the present invention to provide a direct coupled wide band amplifier which may be cascaded with other amplifiers without the necessity of using complicated power supplies, dropping resistors or compensating sources.

These and other objects of the invention will appear more clearly from the following description taken in conjunction with the accompanying drawing.

Referring to the drawing.

Figure 1:
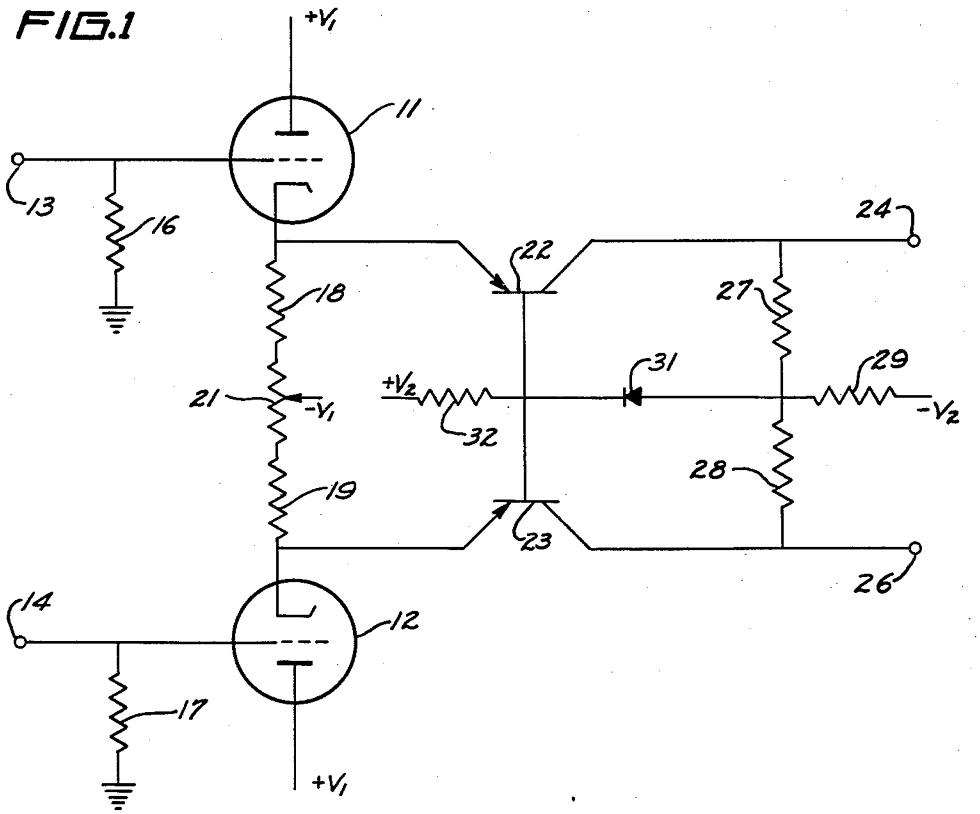
Figure 1 is a circuit diagram of the amplifier of the present invention.

The amplifier shown includes a pair of vacuum tubes, in this example triodes 11 and 12, connected in a balanced circuit. A plate supply voltage $+V_1$ is applied to the plates of the tubes. The input signal may be applied single ended between one of the terminals 13 or 14 and ground, or balanced between the two terminals. Grid leak resistors 16 and 17 are provided for the tubes 11 and 12, respectively.

The cathodes of the tubes are resistively connected by resistors 18, 19 and 21 to a voltage supply $-V_1$. The resistor 21 includes a variable tap for adjusting the D.-C. levels.

A pair of transistors 22 and 23 have their bases interconnected. The emitter of the transistor 22 is connected to the cathode of the tube 11, and the emitter of the transistor 23 is connected to the cathode of the tube 12. The collectors of the transistors are connected to the output terminals 24 and 26. Output resistors 27 and 28 are serially connected between the output terminal.

A current limiting resistor 29 is connected between a minus supply $-V_2$ and the common terminal of the output resistors 27 and 28. The current limiting or stabilizing resistor serves to determine the average current through the transistors. A suitable voltage regulating element is provided between the base of the transistors and the common junction of the output resistors whereby the effect of $I_{co}$ variation due to temperature is minimized. The element may, for example, be a low resistance, a voltage source, such as a battery, or a zener diode 31, as shown. A voltage source $+V_2$ is resistively connected by the resistor 32 to the base of the transistors.

Each transistor is nearly a short circuit on the associated cathode. Thus, the emitter current in each of the transistors 22 and 23 is equal to $$\frac{e_0}{2}g_m$$

where $e_0$ is the input signal voltage and $g_m$ is the tube transconductance. The total output voltage across the output resistors 27 and 28 is substantially equal to the value $e_0 g_m \alpha R$, where R is the load resistance, and $\alpha$ is the alpha of the transistor. In general, transistors have values of $\alpha$ susbtantially equal to one. Thus, the currents flowing through the load resistors 27 and 28 will be substantially equal to the currents through the tube and through the emitter of the transistor. The load is effectively isolated from the tubes by the transistors since any variation in output voltage does not affect the emitter voltage.

The only tube characteristic which is of importance is $g_m$; $\mu$, $r_p$ and tube capacitances are relatively unimportant. The only transistor characteristic of any importance is the cut-off frequency; the output capacitance of the transistors is typically less than that of the tubes. Consequently, the bandwidth is determined primarily by load circuit capacitance.

The D.-C. level of the output signal will be substantially equal to the D.-C. level of the input signal except for the slight differences due to the voltages appearing between the base and collector of the transistors. The voltage is slightly higher or slightly lower depending upon whether n-p-n or p-n-p transistors are employed.

An amplifier in accordance with the foregoing was constructed in which the voltages and circuit elements were as follows:

| | |
|---|---|
| Tubes | 6DJ8. |
| Transistors | 2N384. |
| Zener diode | 8 volts B.D. |
| Voltages: | |
| $+V_{1,2}$ | +100. |
| $-V_{1,2}$ | −100. |
| Resistors: | |
| R16, 17 | 500 Kohms. |
| R18, 19 | 10 Kohms. |
| R21 | 2 Kohms. |
| R27, 28 | 680 ohms. |
| R29 | 20 Kohms. |
| R32 | 100 Kohms. |

Figure 2:
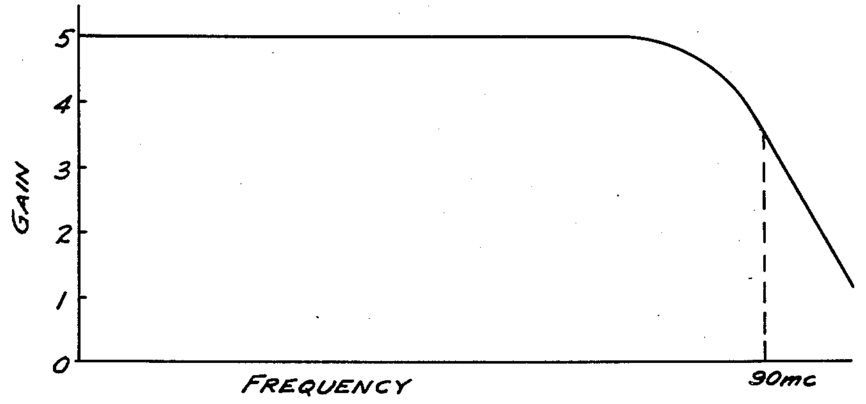
Figure 2 is a curve showing the frequency response of an amplifier in accordance with the invention.

The amplifier constructed in accordance with the foregoing had a frequency response as shown in Figure 2. It is seen that the response is relatively flat from D.-C. to 90 megacycles. The output signal had a D.-C. level of about 5 volts above the D.-C. level of the input signal. It is, of course, apparent that the amplifier may be operated single ended rather than balanced, as described.

Thus it is seen that there is provided an amplifier which employs vacuum tubes and transistors in such a manner that each is used at its best characteristic. The amplifier is relatively independent of changes in $\mu$, $r_p$ of the tube, and $\beta$ of the transistor. The D.-C. level of the output signal is substantially equal to the D.-C. level of the input signal. Simple power supplies may be employed when cascading a plurality of amplifiers. The transistor current is stabilized.

I claim:

1. A direct coupled wide-band amplifier comprising a pair of vacuum tubes connected in a balanced circuit, each of said tubes having at least plate, grid and cathode elements, means for applying an input signal to the grid of at least one of said tubes, means for applying a plate voltage to the plates of said tubes, the cathodes of said tubes being resistively connected to a common point, a pair of transistors connected in a balanced circuit, each of said transistors including at least collector, emitter and base elements, said emitters being D.-C. coupled to the cathodes of said tubes to be driven thereby, said collectors being coupled to output terminals and resistively connected together to another common point, means to connect said bases together, resistive means connecting said bases to a first power supply terminal, resistive means connecting said last-named common point to a second power supply terminal, and a biasing element connecting said bases to said last-named common point.

2. A direct coupled wide-band amplifier according to claim 1 wherein said biasing element is a unilateral conduction device.

3. A direct coupled wide-band amplifier according to claim 2 wherein said biasing element is a zener diode.

References Cited in the file of this patent

UNITED STATES PATENTS

| | | |
|---|---|---|
| 2,680,160 | Yaeger | June 1, 1954 |
| 2,835,795 | Kroger | May 20, 1958 |

FOREIGN PATENTS

| | | |
|---|---|---|
| 150,232 | Australia | Feb. 23, 1953 |